US006909536B1

(12) United States Patent
Walker et al.

(10) Patent No.: US 6,909,536 B1
(45) Date of Patent: Jun. 21, 2005

(54) OPTICAL RECEIVER INCLUDING A LINEAR SEMICONDUCTOR OPTICAL AMPLIFIER

(75) Inventors: Jeffrey D. Walker, El Cerrito, CA (US); James A. Witham, Menlo Park, CA (US); Sol P. DiJaili, Moraga, CA (US); John M. Wachsman, Dublin, CA (US)

(73) Assignee: Finisar Corporation, Sunnyvale, CA (US)

( * ) Notice: Subject to any disclaimer, the term of this patent is extended or adjusted under 35 U.S.C. 154(b) by 329 days.

(21) Appl. No.: 10/017,201

(22) Filed: Dec. 14, 2001

Related U.S. Application Data

(63) Continuation-in-part of application No. 10/014,679, filed on Dec. 11, 2001.
(60) Provisional application No. 60/274,419, filed on Mar. 9, 2001, and provisional application No. 60/255,753, filed on Dec. 14, 2001.

(51) Int. Cl.[7] .............................. H01S 3/00; H04B 10/06
(52) U.S. Cl. ...................... 359/337; 359/344; 398/202
(58) Field of Search .................... 398/202; 359/337, 359/344, 340, 341.3, 341.32, 160, 134; 372/70, 72, 8

(56) References Cited

U.S. PATENT DOCUMENTS

| 3,467,906 | A | 9/1969 | Cornely et al. ............. 330/4.3 |
| 3,828,231 | A | 8/1974 | Yamamoto .................. 357/30 |
| 4,794,346 | A | 12/1988 | Miller |
| 5,299,054 | A | 3/1994 | Geiger |
| 5,305,412 | A | 4/1994 | Paoli |
| 5,436,759 | A | 7/1995 | Dijaili et al. ............. 359/333 |
| 5,604,628 | A | 2/1997 | Parker et al. |
| 5,654,822 | A | 8/1997 | Ducellier et al. |
| 5,673,141 | A | 9/1997 | Gambini |
| 5,748,653 | A | 5/1998 | Parker et al. |
| 5,754,571 | A | 5/1998 | Endoh et al. |
| 5,771,320 | A | 6/1998 | Stone |
| 5,778,132 | A | 7/1998 | Csipkes et al. |
| 5,805,322 | A | 9/1998 | Tomofuji |
| 5,949,807 | A | 9/1999 | Fujimoto et al. ............. 372/45 |
| 5,960,024 | A | 9/1999 | Li et al. .................... 372/96 |
| 5,999,293 | A | 12/1999 | Manning |
| 6,044,100 | A | 3/2000 | Hobson et al. .............. 372/46 |
| 6,061,156 | A | 5/2000 | Takeshita et al. |
| 6,115,517 | A | 9/2000 | Shiragaki et al. ............ 385/24 |
| 6,128,115 | A | 10/2000 | Shiragaki |
| 6,215,583 | B1 | 4/2001 | Lagerstrom et al. |
| 6,243,407 | B1 * | 6/2001 | Mooradian ................ 372/92 |

(Continued)

FOREIGN PATENT DOCUMENTS

| JP | 56006492 | 1/1981 | ............. H01S/3/18 |
| JP | 01129483 | 11/1987 | ............. H01S/3/18 |
| JP | 10190147 | 7/1998 | ............. H01S/3/18 |
| JP | 02000012978 A | 1/2000 | |

OTHER PUBLICATIONS

S. Diez et al., *All–Optical Switch for TDM and WDM/TDM Systems Demonstrated in a 640 Gbit/s Demultiplexing Experiment*, Electronics Letters, vol. 34, No. 8, pp. 803–805, Apr. 16, 1988.

(Continued)

*Primary Examiner*—Mark Hellner
(74) *Attorney, Agent, or Firm*—Workman Nydegger

(57) ABSTRACT

An improved optical receiver comprises a vertically lasing semiconductor optical amplifier (VLSOA) coupled to a photodetector. The VLSOA and photodetector are discrete devices or alternatively integrated onto a common substrate. The integrated optical receiver may be fabricated using a number of different methods, including based on selective area epitaxy, impurity induced disordering, etch and fill and silicon optical bench.

29 Claims, 9 Drawing Sheets

U.S. PATENT DOCUMENTS

| | | | |
|---|---|---|---|
| 6,317,531 B1 | 11/2001 | Chen et al. | |
| 6,333,799 B1 | 12/2001 | Bala et al. | |
| 6,335,992 B1 | 1/2002 | Bala et al. | |
| 6,347,104 B1 | 2/2002 | Dijaili et al. | |
| 6,445,495 B1 * | 9/2002 | Walker et al. | 359/344 |
| 6,462,865 B1 | 10/2002 | Chu et al. | |
| 6,512,629 B1 * | 1/2003 | Dijaili et al. | 359/344 |
| 6,522,462 B2 | 2/2003 | Chu et al. | |
| 6,577,654 B1 | 6/2003 | Dijaili et al. | |
| 6,647,041 B1 * | 11/2003 | Verma et al. | 372/45 |
| 6,707,600 B1 | 3/2004 | Dijaili et al. | |
| 6,714,344 B2 | 3/2004 | Islam et al. | |
| 2002/0001112 A1 | 1/2002 | Song | |
| 2004/0012845 A1 * | 1/2004 | Wang | 359/344 |
| 2004/0017604 A1 * | 1/2004 | DiJaili et al. | 359/341.41 |

OTHER PUBLICATIONS

S. Diez et al., *Gain–Transparent SOA–Switch for High–Bitrate OTDM Add/Drop Multiplexing*, IEEE Photonic Technology Letters, vol. 11, No. 1, pp. 60–62, Jan. 1999.

S. Diez et al., *Novel Gain–Transparent SOA–Switch for High Bitrate ODTM Add/Drop Multiplexing*, ECOC 1998, vol. 1, pp. 461–462, Sep. 1998.

B. Femier et al., *Fast (3000 ps) Polarization Insensitive Semiconductor Optical Amplifier Switch with Low Driving Current (70 mA)*, Semiconductor Laser Conference, Conference Digest, 14$^{th}$ IEEE International, pp. 130–131, Sep. 21–15, 1992.

J.E. Fouquet et al., *Compact, Scalable Fiber Optic Cross–Connect Switches*, IEEE, 1999 Digest of the LEOS Summer Topical Meetings, pp. 59–60, 1999.

M.M. Ibrahim, *Photonic Switch Using Surface–Emitting Laser Diode and AOD*, 16$^{th}$ National Radio Science Conference, NRSC 1999, pp. 1–8, Ain Shams University, Cairo, Egypt, Feb. 23–25, 1999.

J. Mork et al., *Semiconductor Devices for All–Optical Signal Processing: Just How Fast Can They Go?*, IEEE Lasers and Electro–Optics Society 1999 12$^{th}$ Annual Meeting, LEOS 1999, vol. 2, pp. 900–901, Nov. 8–11, 1999.

K. Panajotov et al., *Polarisation Switching in Proton–Implanted VCSELs*, 1999 Digest of the LEOS Summer Topical Meetings, pp. 55–56, Jul. 26–30, 1999.

B.C. Qui et al., *Monolithically Integrated Fabrication of 2×2 and 4×4 Crosspoint Switches Using Quantum Well Intermixing*, 2000 International Conference on Indium Phosphide and Related Materials, Conference Proceedings, pp. 415–418, May 14–18, 2000.

J. Scheuer et al., *Nonlinear On–Switching of High Spatial Frequency Patterns in Ring Vertical Cavity Surface Emitting Lasers*, 1999 IEEE LEOS Annual Meeting Conference Proceedings, 12$^{th}$ Annual Meeting, IEEE Lasers and Electro–Optics Society 1999 Annual Meeting, vol. 1, pp. 123–124, Nov. 8–9, 1999.

H. Soto et al., *All–Optical Switch Demonstration Using a Birefringence Effect in a Semiconductor Optical Amplifier*, IEEE CLEO, Pacific rim 1999, pp. 886–889, 1999.

N. Yoshimoto et al., *Spot–Size Converted Polarization–Insensitive SOA Gate with a Vertical Tapered Submicrometer Stripe Structure*, IEEE Photonics Technology Letters, vol. 10, No. 4, pp. 510–512, Apr. 4, 1998.

Wolfson et al., *Detailed Theoretical Investigation of the Input Power Dynamic Range for Gain–Clamped Semiconductor Optical Amplifier Gates at 10 Gb/s*, IEEE Photonics Technology Letters, 1998, vol. 10, No. 9, pp. 1241–1243.

F. Robert et al., *All–Optical Set–Rest Operation of a Bistable Semiconductor Laser Intracavity–Coupled to a Vertical–Cavity Surface–Emitting Laser*, IEEE Photonic Technology, Letters, vol. 12, No. 5, May 2000, pp. 465–467.

D.B. Shire et al., *Gain Controlled Vertical Cavity Surface Emitting Lasers Coupled with Intracavity In–plane Lasers*, Appl. Phys. Lett. vol. 66, No. 14, Apr. 3, 1995, pp. 1717–1719.

Agility Unveils Long–Haul Laser, Light–Reading—The Global Site for Optical Networking, retrieved from internet www.lightreading.com/document.asp, Mar. 30, 2001.

Alcatel, "Alcatel Optronics introduces a Gain–Clamped Semiconductor Optical Amplifier," *Press Release for Immediate Publication*, OFC '98, San Jose (Feb. 1998), 1 unnumbered page.

Bauer, B. et al., "Gain Stabilization of a Semiconductor Optical Amplifier by Distributed Feedback," *IEEE Photonics Technology Letters*, vol. 6, No. 2 (Feb. 1994), pages 182–185.

Dorgeuille, F., et al., "1.28 Tbit/s Throughput 8×8 Optical Switch Based on Arrays of Gain–Clamped Semiconductor Optical Amplifier Gates," Optical Fiber Communication Conference, vol. 4, pp. 221–223, Mar. 2000.

Dorgeuille, F., et al., H., "Fast Optical Amplifier Gate Array for WDM Routing and Switching Applications," OFC '98 Technical Digest, pp. 42–44, 1998.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, vol. Conf. 14 (Sep. 14, 1994), pp. 185–186.

Evankow, Jr., J.D., et al., "Photonic Switching Modules Designed with Laser Diode Amplifiers," IEEE, Journal on Selected Areas in Communications, vol. 6, No. 7, pp. 1087–1095, Aug. 1988.

Gee, S. et al., "High–Power Mode–Locked External Cavity Semiconductor Laser Using Inverse Bow–Tie Semiconductor Optical Amplifiers," *IEEE Journal of Selected Topics in Quantum Electronics*, vol. 4, No. 2, Mar./Apr. 1998, pp. 209–215.

Jeong, G., et al., "Gain Optimization in Switches Based on Semiconductor Optical Amplifiers," Journal of Lightwave Technology, Vo. 13, No. 4, pp. 598–605, Apr. 1995.

Joyner, C.H. et al., "Extremely Large Band Gap Shifts for MQW Structures by Selective Epitaxy on SiO2 Masked Substrates," *IEEE Photonoics Technology Letters*, vol. 4, No. 9 (Sep. 1992), pp. 1006–1009.

Kitamura, S., et al., "Spot–Size Converter Integrated Semiconductor Optical Amplifiers for Optical Gate Applications," IEEE Journal of Quantum Electronics, vol. 35, No. 7, pp. 1067–1074, Jul. 1999.

Koyama, F., et al., "Multiple–Quantum–Well GaInAs/GaInAsP Tapered Broad–Area Amplifiers with Monolithically Integrated Waveguide Lens for High–Power Applications," IEEE Photonics Technology Letters (Aug. 1993), vol. 5, No. 8, pp. 916–919.

Leuthold, J., et al., "All–Optical Space Switches with Gain and Principally Ideal Extinction Ratios," IEEE Journal of Quantum Electronics, vol. 34, No. 4, pp. 622–633, Apr. 1998.

McAdams, L.R. et al., "Linearizing High Performance Semiconductor Optical Amplifiers: Techniques and Performance," LEOS Presentation (1996), pp. 363–364.

Mutalik, V.G. et al., "Analog performance of 1310–nm gain–clamped semiconductor optical amplifiers," *OFC '97 Technical Digest*, Thursday Morning, 11:15 AM, pp. 266–267.

Simon, J.C. et al., "Travelling wave semiconductor optical amplifier with reduced nonlinear distortions," *Electronics Letters*, vol. 30, No. 1 (Jan. 6, 1994), pp. 49–50.

Soulage, G. et al., "Clamped Gain Travelling Wave Semiconductor Optical Amplifier as a Large Dynamic Range Optical Gate," Alcatel Alsthom Recherche, rout de Nozay, 91460 Marcoussis, France, undated, 4 unnumbered pages.

Tai, C., et al., "Dynamic Range and Switching Speed Limitations of an N×N Optical Packet Switch Based on Low–Gain Semiconductor Optical Amplifiers," IEEE Journal of Lightwave Technology, vol. 14, No. 4, pp. 525–533, Apr. 4, 1996.

Tiemeiijer, L.F. et al., "1310–nm DBR–Type MQW Gain–Clamped Semiconductor Optical Amplifiers with AM–CATV–Grade Linearity," *IEEE Photonics Technology Letters*, vol. 8, No. 11 (Nov. 1996), pp. 1453–1455.

Tiemeijer, L.F. et al., "High–Gain 1310 nm Semiconductor Optical Amplifier Modules with a Built–in Amplified Signal Monitor for Optical Gain Control" *IEEE Photonics Technology Letters*, vol. 9, No. 3 (Mar. 1997), pp. 309–311.

Tiemeijer, L.F. et al., "Reduced Intermodulation Distrotion in 1300 nm Gain–Clamped MQW Laser Amplifiers," *IEEE Photonics Technology Letters*, vol. 7, No. 3 (Mar. 1995), pp. 284–286.

Toptchiyski, G., et al., "Time–Domain Modeling of Semiconductor Optical Amplifiers for OTDM Applications," IEEE Journal of Lightwave Technology, Vol. 17, No. 12, pp. 2577–2583, Dec. 1999.

van Roijen, R., et al.., "Over 15 dB Gain from a Monolithically Integrated Optical Switch with an Amplifier," IEEE Photonics Technology Letters, vol. 5, No. 5, pp. 529–531, May 1993.

Walker, J.D. et al., "A Gain–Clamped, Crosstalk Free, Vertical Cavity Lasing Semiconductor Optical Amplifier for WDM Applications," summaries of the papers presented at the topical meeting, Integrated Photonics Search; 1996 Technical Digest Series; Proceedings of Integrated Photonics; Boston, MA, USA, 29.04–02.05 1996, vol. 6, Apr. 29–May 5, 1996, vol. 6, pp. 474–477.

* cited by examiner

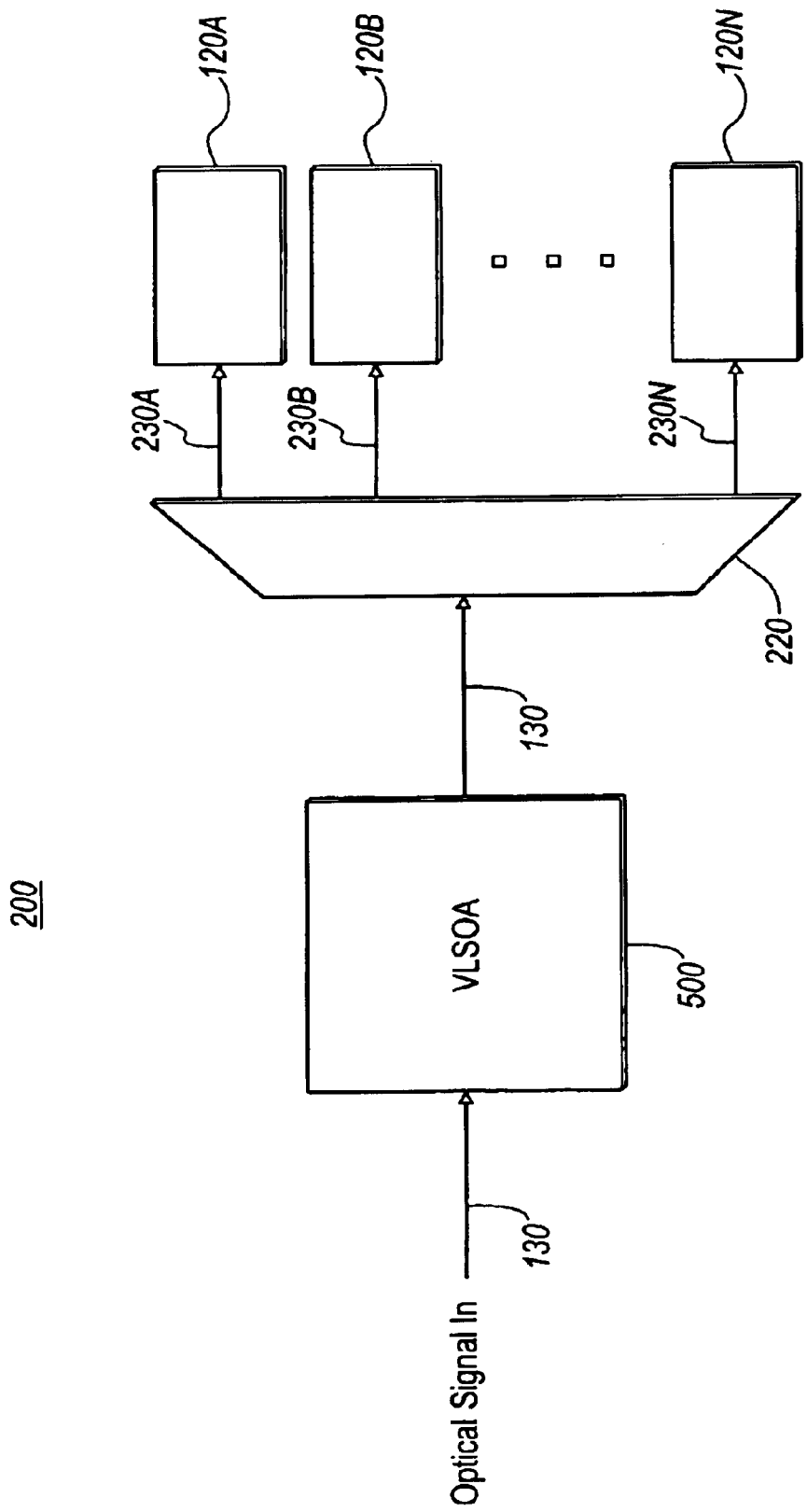

OPTICAL RECEIVER INCLUDING A LINEAR SEMICONDUCTOR OPTICAL AMPLIFIER

CROSS-REFERENCE TO RELATED APPLICATIONS

This application claims priority under 35 U.S.C. § 119(e) to U.S. Provisional Patent Application Ser. No. 60/274,419, "Optical Receiver Including a Linear Semiconductor Optical Amplifier," by Jeffrey D. Walker and James A. Witham, filed Mar. 9, 2001; and U.S. Provisional Patent Application Serial No. 60/255,753, "Optical Devices including a Semiconductor Optical Amplifier," by Jeffery D. Walker et al., filed Dec. 14, 2000.

This application is a continuation-in-part of pending U.S. patent application Ser. No. 10/014,679, "Integrated Optical Device Including a Vertical Lasing Semiconductor Optical Amplifier," by Jeffrey D. Walker et al., filed Dec. 11, 2001.

The subject matter of all of the foregoing is incorporated herein by reference in their entirety.

BACKGROUND OF THE INVENTION

1. Field of the Invention

This invention relates generally to semiconductor optical amplifiers. More particularly, it relates to vertically lasing semiconductor optical amplifiers (VLSOAs) used in combination with a photodetector to create an improved optical receiver.

2. Description of the Related Art

Fiber optic systems are used to transmit information at high speeds over large distances. At a high level, a typical optical system consists of an optical transmitter and an optical receiver with an optical fiber connecting the two. The optical transmitter converts an electrical signal into an optical signal and transmits the signal over the optical fiber. The optical receiver receives the optical signal from the optical fiber and converts the signal back into an electrical signal.

For current systems running at bit rates less than 10 billion bits per second (Gbps), a common design for the optical receiver is based on a PIN diode coupled to a transimpedance amplifier (TIA). The optical signal enters the PIN diode and creates electron-hole pairs inside the PIN diode. The electrons and holes accelerate to opposite ends of the PIN diode resulting in a flow of current that varies with the strength of the incoming optical signal. The electrical signal resulting from this flow is then output to the TIA, where the signal is amplified and output to further electronic circuitry.

However, as bit rates increase above 10 Gbps, optical amplifiers are desirable to pre-amplify the optical signal before it reaches the photodetector. In other words, it is difficult to produce a high sensitivity, high gain electronic amplifier capable of operating at these higher data rates. As a result, it becomes more desirable to provide amplification optically via an optical amplifier located before the detector rather than electronically via an electronic amplifier located after the detector. This optical pre-amplification results in improved receiver sensitivity and a larger amplitude photocurrent at the photodetector. This larger photocurrent can then be amplified further, or in some cases directly input into further electronic circuitry. Pre-amplification also increases the signal to noise performance of the overall system in certain types of detection systems. Optical amplifiers are also used to adjust the power of the incoming signal to match the operating region of the photodetector. For example, a typical power range is −3 to −14 dBm for common PIN diodes, —3 to −18 dBm for more expensive PIN diodes, and —9 to −24 dBm for avalanche photodiodes (APDs).

Fiber amplifiers are one type of optical amplifier. Fiber amplifiers include a length of fiber which has been doped to form an active gain medium. Ions of rare-earth metals, such as erbium, are typically used as the dopant. The doped fiber is typically pumped by an optical pump at a wavelength which is preferentially absorbed by the ions but different from the wavelength of the optical signal to be amplified. The pumping results in a population inversion of electronic carriers in the active medium. Then, as the optical signal propagates through the doped fiber, it is amplified due to stimulated emission.

One drawback of fiber amplifiers is that they typically only operate over a narrow wavelength range when multiple fiber amplifiers are cascaded. This is especially problematic if the optical signal to be amplified covers a wide range of wavelengths, as would be the case if the entire bandwidth of the optical fiber is to be efficiently utilized. Another disadvantage of fiber amplifiers is their transient response to channel drop-out in wavelength division multiplexing systems. Further problems with fiber amplifiers include slow switching speed, power inefficiency, difficulties in mass producing them, and their high cost which makes them prohibitively expensive for many applications. Another major drawback of fiber amplifiers is their inherently large size.

Semiconductor optical amplifiers (SOAs) are another type of optical amplifier. SOAs contain a semiconductor active region and an electrical current typically is used to pump the electronic population in the active region. An optical signal propagating through the active region experiences gain due to stimulated emission.

Conventional SOAs are non-lasing. One problem with non-lasing semiconductor optical amplifiers is that the gain depends on the amplitude of the optical signal. This problem is the result of gain saturation, in which there are insufficient carriers in the conduction band to provide the full amount of gain to higher power signals. As a result, a strong optical signal is amplified less than a weak signal and strong portions of the optical signal are amplified less than weak portions. This results in distortion of the optical signal and the possibility of crosstalk between different optical signals propagating simultaneously through the system. This significantly limits the use of conventional SOAs, especially in optical systems operating at high speeds and in wavelength division multiplexed optical systems. Further, the non-linearity of the amplification in conventional SOAs leads to crosstalk between bits in high frequency time division multiplexed (TDM) systems (commonly referred to as intersymbol interference). Due to the TDM crosstalk, non-lasing SOAs are typically limited to output powers below 1 mW or bit rates well below 2.5 Gbps.

What is needed is an optical receiver, including an optical amplifier, that is small in size, inexpensive and can be used to detect time division multiplexed (TDM) and wavelength division multiplexed (WDM) optical signals at high bit rates, for example, bit rates greater than 10 Gbps.

SUMMARY OF THE INVENTION

An improved optical receiver includes a vertically lasing semiconductor optical amplifier (VLSOA) coupled, either directly or indirectly (including possibly intervening elements) to a photodetector. The VLSOA includes a semiconductor active region and a vertical laser cavity. An amplifying path traverses the semiconductor active region and the vertical laser cavity includes the semiconductor active region. Optical signals are amplified as they propagate along the amplifying path. The laser cavity is pumped above a lasing threshold, thereby clamping the gain along the amplifying path to a substantially constant value. The amplified optical signal is detected by the photodetector.

In one implementation, the VLSOA is coupled directly to the photodetector. In another implementation, the VLSOA is coupled to the photodetector by an optical fiber, optical waveguide, free space optics (e.g., a lens) or other passive element. In yet another implementation, there are more complex elements (e.g., splitters, filters, additional amplifiers, isolators) located between the VLSOA and photodetector.

In one embodiment, the VLSOA is coupled to a plurality of photodetectors by a wavelength division demultiplexer. In this embodiment, wavelength division multiplexed (WDM) optical signals are amplified as they propagate through the VLSOA. The wavelength division demultiplexer splits the incoming WDM optical signals into a plurality of single wavelength optical signals. Each of these single wavelength optical signals is then detected by one of the plurality of photodetectors. In one variation, each photodetector is preceded by its own amplifier, which may be used to equalize the signals.

In another aspect of the invention, the VLSOA and the photodetector are integrated onto a common substrate. In one implementation, the semiconductor active region of the VLSOA transitions into the active region of the photodetector. In one example, the VLSOA active region and the photodetector active region include the same p-i-n waveguide structure but have different electrical biases. The VLSOA section is forward biased to provide gain and the PIN photodetector section is reverse biased to collect photogenerated electron-hole pairs and thereby produce a photocurrent proportional to the received light. Alternately, the VLSOA active region and photodetector active region may be fabricated based on a common structure which is altered so that the VLSOA active region and photodetector active region have different transition energies. For example, the active region of the photodetector may be designed to have lower transition energy than the active region of the VLSOA in order to increase absorption within the photodetector active region.

The present invention is advantageous because the linear gain characteristics of the VLSOA significantly reduce WDM and TDM crosstalk when amplifying optical signals. As a result, the VLSOA can pre-amplify optical signals (including TDM and WDM optical signals) to improve receiver sensitivity, reduce the requirements and cost of electronic receiver circuitry and/or boost WDM signals prior to demultiplexing. The present invention is also advantageous because the integration of VLSOAs with a photodetector on a common substrate supports the building of integrated optical receivers and other optical circuits. This, in turn, will accelerate the adoption and development of optical technologies.

BRIEF DESCRIPTION OF THE DRAWINGS

FIG. 2 is a block diagram of a VLSOA in combination with a wavelength division demultiplexer and a plurality of photodetectors.

DETAILED DESCRIPTION OF THE PREFERRED EMBODIMENTS

Figure 1:
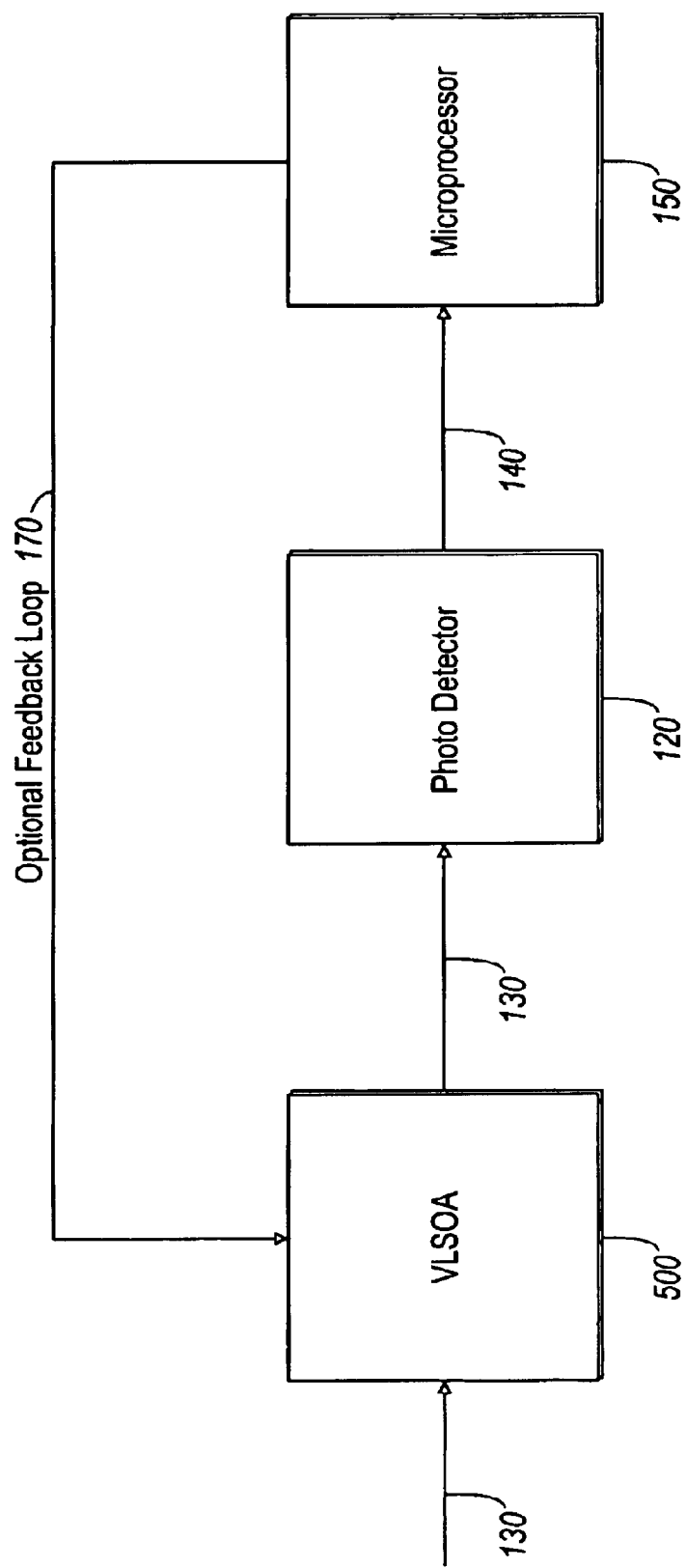
FIG. 1 is a block diagram of a VLSOA in combination with a photodetector and a microprocessor.

FIGS. 1 and 2 are block diagrams of example optical receivers in which a VLSOA is coupled to a photodetector, either directly or indirectly. Each of FIGS. 1 and 2 depicts a VLSOA in combination with some other optical element. In some embodiments, these combinations are implemented as combinations of discrete devices, which may be also packaged separately or which may be combined into a single package. For example, in one embodiment of FIG. 1, the VLSOA 500 and photodetector 120 are separate discrete devices, and they are coupled together by optical fibers 130. In a preferred embodiment, the combinations shown in FIGS. 1 and 2 are implemented as integrated optics, in which multiple optical elements are integrated onto a common substrate. Applying this approach to FIG. 1, the VLSOA 500 and photodetector 120 are integrated onto a common substrate to make a single chip transmitter. The integrated and discrete approaches may be combined to form hybrid versions. For example, in FIG. 2, the VLSOA 500 and wavelength division demultiplexer (WDD) 220 may be integrated, the photodetectors 120 may be integrated as an array, and the two integrated combinations may then be coupled to each other via fibers, free space optics or other means.

FIG. 1 is a block diagram of a VLSOA 500 coupled to a photodetector 120. In this particular example, the VLSOA 500 is coupled to photodetector 120 by an optical fiber 130. In this embodiment, photodetector 120 is coupled to a microprocessor 150 through electrical interconnects 140. VLSOA 500 receives an optical signal from another optical fiber 130 and amplifies the optical signal as it propagates through the active region of VLSOA 500. Photodetector 120 receives the amplified optical signal from VLSOA 500 and converts the optical signal to an electrical signal which is then processed by microprocessor 150. Examples of photodetector 120 include but are not limited to PIN photodetectors and avalanche photodiodes (APDs). In many applications, a narrow band filter is used in front of the photodetector to improve noise characteristics of the receiver (not shown). Microprocessor 150 is merely representative of the electronic circuitry used to process the output of photodetector 120. Many other types of electronic circuitry may be used in place of microprocessor 150, for example analog circuitry, digital circuitry, ASICs, or off-the-shelf chips.

The use of VLSOA 500 as the amplifier has significant advantages over other types of optical amplifiers. As mentioned previously, fiber amplifiers typically are large, expensive optical devices that cannot be integrated with a photodetector and conventional SOAs are limited in power output and speed (due to intersymbol interference). By contrast, VLSOA 500 is small, inexpensive and can be integrated on a common substrate with a photodetector. In addition, VLSOAs do not have the intersymbol interference problems that are inherent in non-lasing SOAS. This enables a single-chip receiver with increased sensitivity and low overall cost (including the corresponding electronics) in comparison to other alternatives, particularly at data rates above 10 Gbps.

In another example, a control signal for microprocessor 150 is used to adjust the gain of VLSOA 500 in a feedback loop 170, in order to maintain an optimum average received power level at photodetector 120. This increases the dynamic range of the receiver and thereby allows the receiver to compensate for changes in loss within an optical network. Further, it significantly reduces the dynamic range requirements of photo detector 120 and microprocessor 150, enabling lower cost and improved performance in these components. Examples of VLSOAs 500 with adjustable gain in corresponding control techniques are described further in the following U.S. patents and pending patent applications, which are incorporated herein by reference in their entirety: U.S. Pat. No. 6,445,495 "Tunable-Gain Lasing Semiconductor Optical Amplifier," issued Sep. 3, 2002, by Jeffrey D. Walker et. al.; U.S. Pat. No. 6,347,104, "Optical Signal Power Monitor and Regulator," issued Feb. 12, 2002, by Sol P. Dijaili and Jeffrey D. Walker; and U.S. patent application Ser. No. 09/967,859, "Multistage Tunable Gain Optical Amplifier," filed Sep. 28, 2001 by Sol P. Dijaili and John M. Wachsman.

FIG. 2 is a block diagram of an optical receiver 200 which uses wavelength division multiplexing (WDM). In this embodiment, VLSOA 500 is coupled to a plurality of photodetectors 120A–N by a wavelength division demultiplexer (WDD) 220. VLSOA 500 amplifies the incoming WDM optical signal and passes the amplified signal to WDD 220. WDD 220 splits the incoming signal into a plurality of optical signals 230A–N, each of a different wavelength. These single wavelength optical signals 230A–N are detected by their respective photodetectors 120A–N. This embodiment allows for simultaneous detection of multiple optical signals traveling on different wavelengths through the optical system, as is the case when wavelength division multiplexing is used in the optical system. In another embodiment, VLSOAs 500A–N (or even other types of amplifiers) are placed between WDD 220 and photodetectors 120A–N. Positioning additional amplifiers between WDD 220 and photodetectors 120A–N provides the further advantage of equalizing the signal strength of the different channels prior to detection by photodetectors 120A–N. In another embodiment, a power splitter (including both discrete fiber or integrated waveguide types) or other types of optical splitters are used in place of WDD 220 in FIG. 2.

In addition to the advantages discussed above with respect to FIG. 1, VLSOA 500 provides additional advantages in the embodiment described in FIG. 2. For example, there is a significant cost advantage at all data rates because a single VLSOA can be shared among many WDM channels. This is enabled by the VLSOA's ability to support high output powers (>5 mW) without introducing WDM or TDM crosstalk. Thus, in an 8 channel system, a single VLSOA 500 can amplify each channel to an output power of 1 mW/channel at the input of WDD 220. This high per channel power allows for typical 5–10 dB loss within the WDD, improves receiver sensitivity, and enables the use of lower cost/performance photodetectors and electronics. By contrast, conventional non-lasing SOAs have such poor crosstalk performance and associated limited output power that they typically cannot be used in this type of application for all practical purposes. Thus, a non-lasing SOA could not be substituted for VLSOA 500. Without an amplifier in front of WDD 220 to make up for losses, the optical signals are generally too weak to be detected by detectors 120A–N. In addition, non-lasing SOAs and fiber amplifiers (such as EDFAs) suffer from channel dropout. That is, there is a gain transient when WDM channels are added or dropped from the signal being amplified. This further limits their use with WDM optical signals, especially when compared to VLSOA 500.

In one embodiment, the combination of VLSOA 500 and photodetector 120 are implemented as discrete devices. For example, referring to FIG. 1, VLSOA 500 and photodetector 120 may be separate discrete components, which are coupled together by an optical fiber 130, with the entire combination contained in a single package. Alternatively, VLSOA 500 and photodetector 120 may be implemented as separate packages. Alternatively, the combinations may be implemented as integrated optics, in which the optical elements are integrated onto a common substrate. For example, VLSOA 500 and photodetector 120 may be integrated onto a common substrate using the techniques described herein. When integrated, VLSOA 500 and photodetector 120 may be directly coupled to each other, for example the active region of the VLSOA coupled directly to the active region of the detector. Alternately, they may be coupled by integrated structures such as waveguides. The same is true for the optical receiver described in FIG. 2. In alternate embodiments, WDD 220, VLSOAs 500 and detectors 120A–N are separate discrete devices or alternatively could be integrated on a common substrate using the techniques described herein.

Figure 3A:
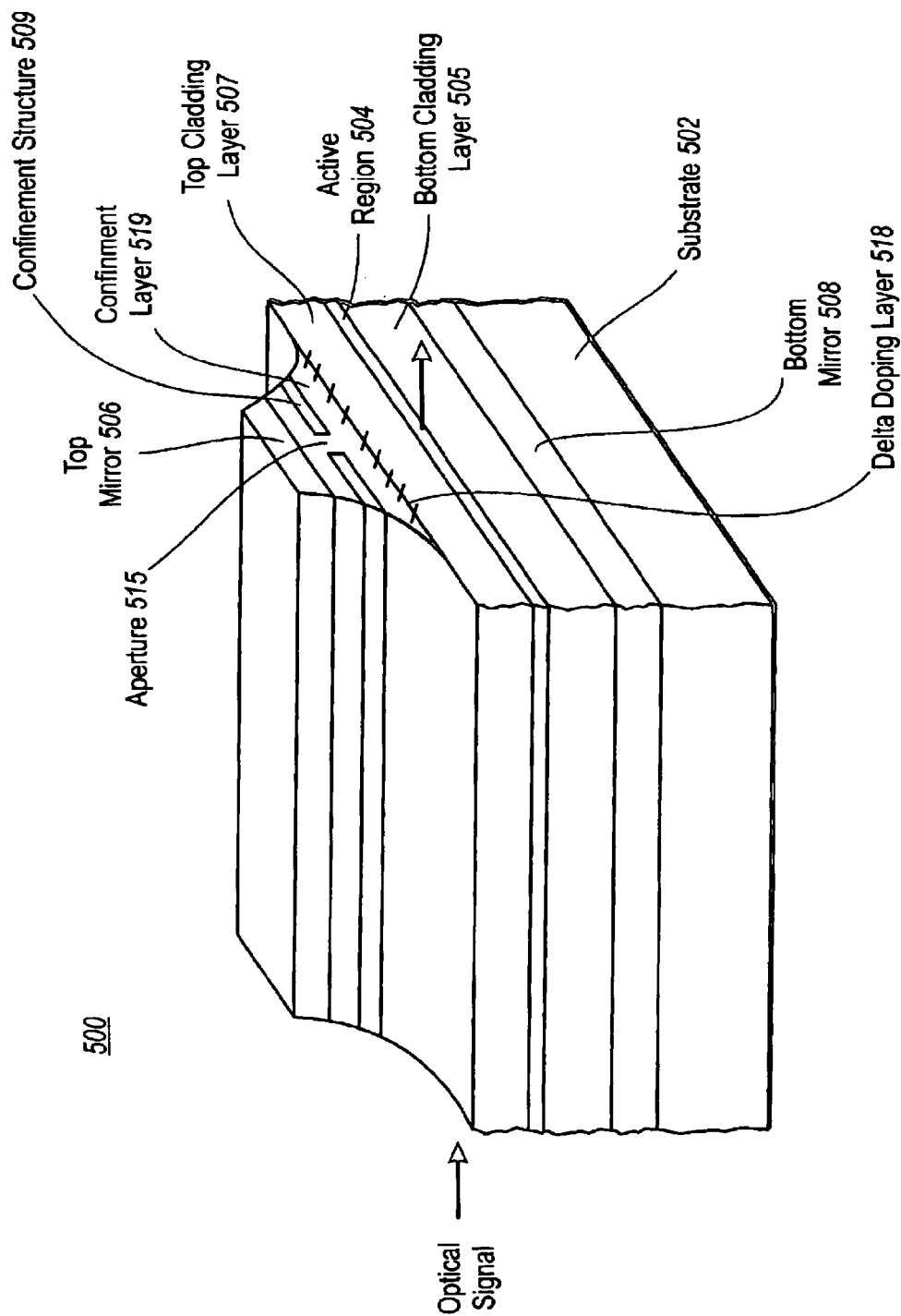
FIGS. 3A–C are a perspective view, transverse cross-sectional view, and a longitudinal cross-sectional view of one embodiment of a vertically lasing semiconductor optical amplifier (VLSOA) 500.
Figure 3B:
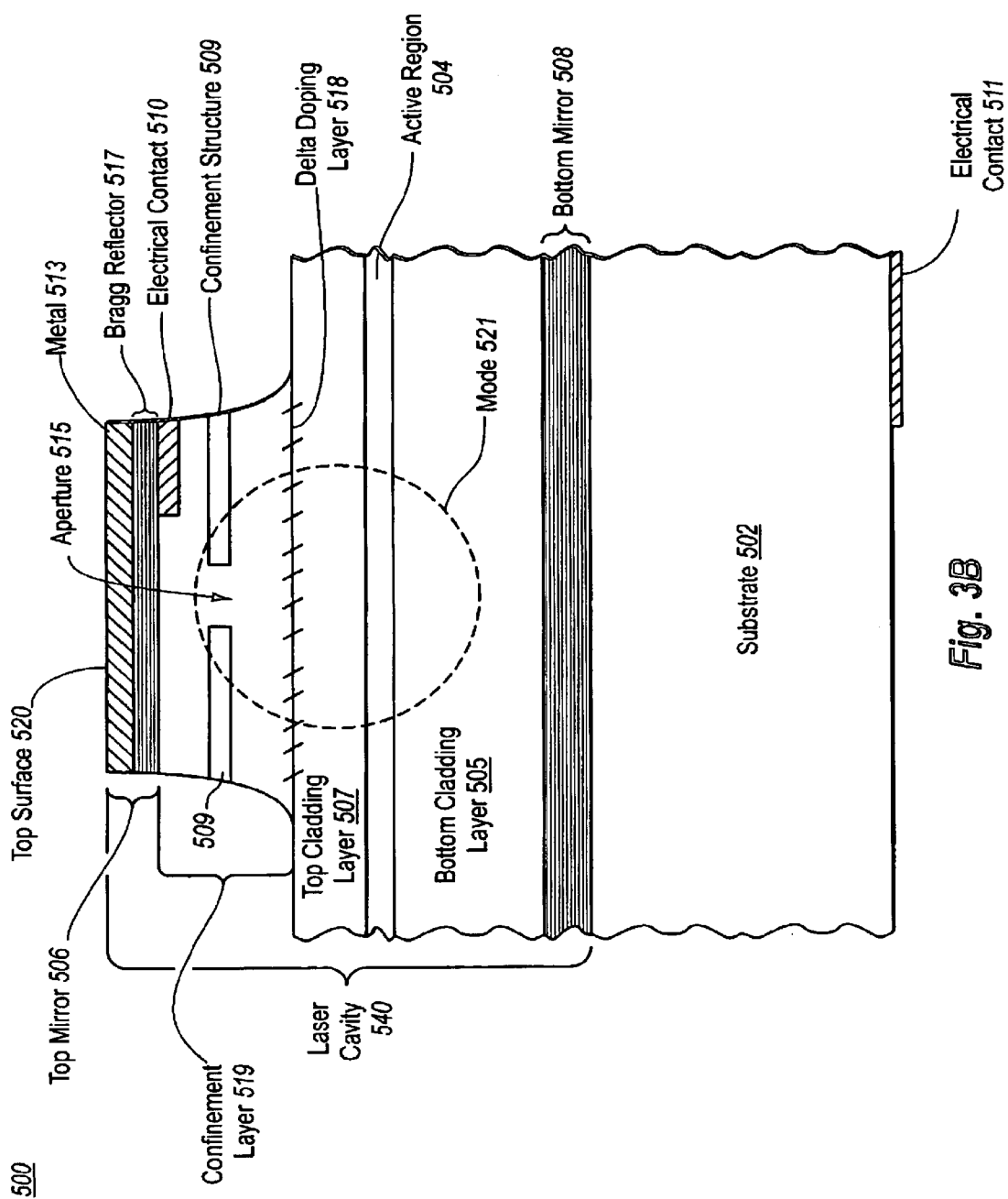
Figure 3C:
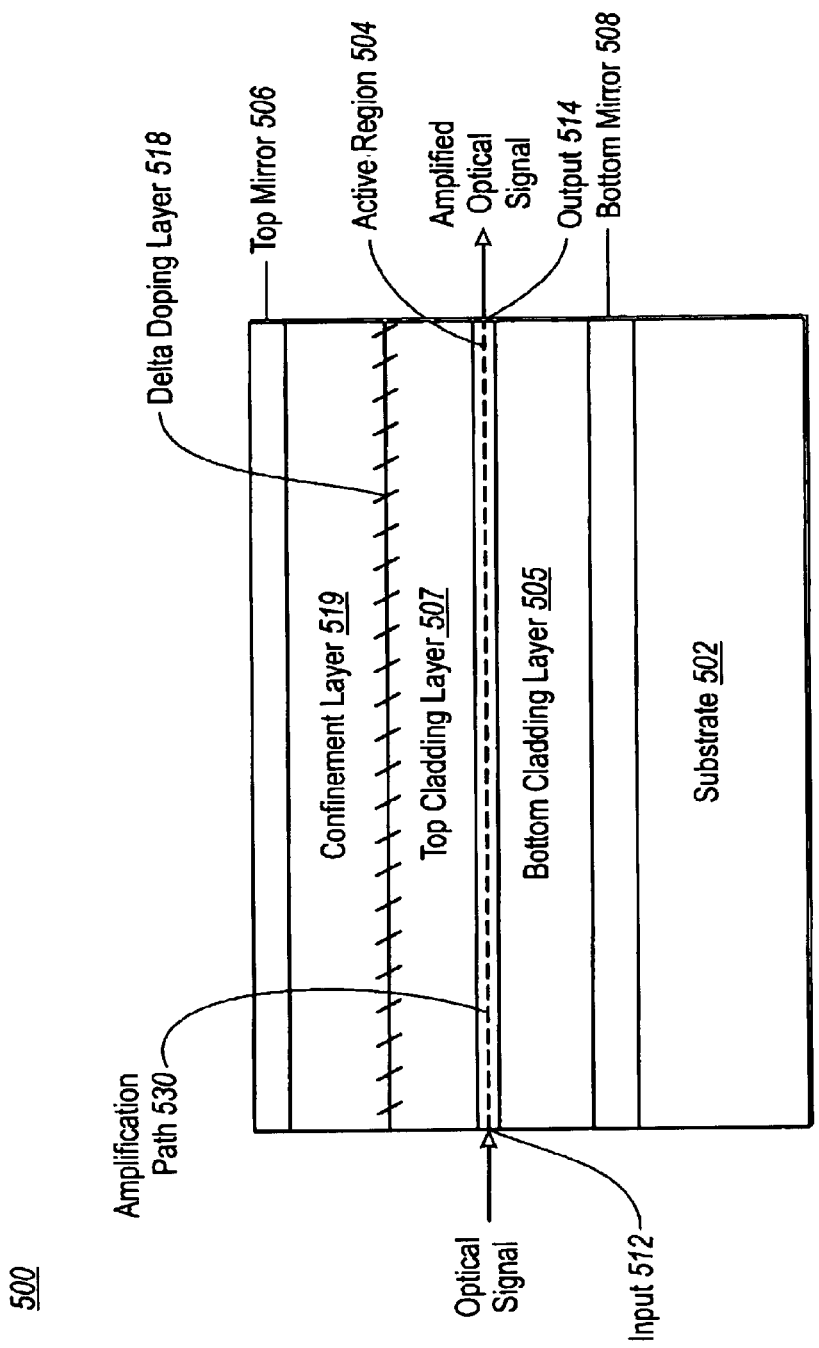

FIGS. 3A–3C are a perspective view, transverse cross-section, and longitudinal cross-section, respectively, of one embodiment of VLSOA 500 according to the present invention, with FIG. 3B showing the most detail.

Referring to FIG. 3B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 3B.

The choice of materials system will depend in part on the wavelength of the optical signal to be amplified, which in turn will depend on the application. Wavelengths in the approximately 1.3–1.7 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In one embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 3 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510, 511 are metals that form an ohmic contact with the semiconductor material. Commonly used metals include titanium, platinum, nickel, germanium, gold, palladium, and aluminum.

In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 3, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current. Other confinement techniques may also be used, including those based on ion implantation, impurity induced disordering, ridge waveguides, buried tunnel junctions, and buried heterostructures.

Figure 4:
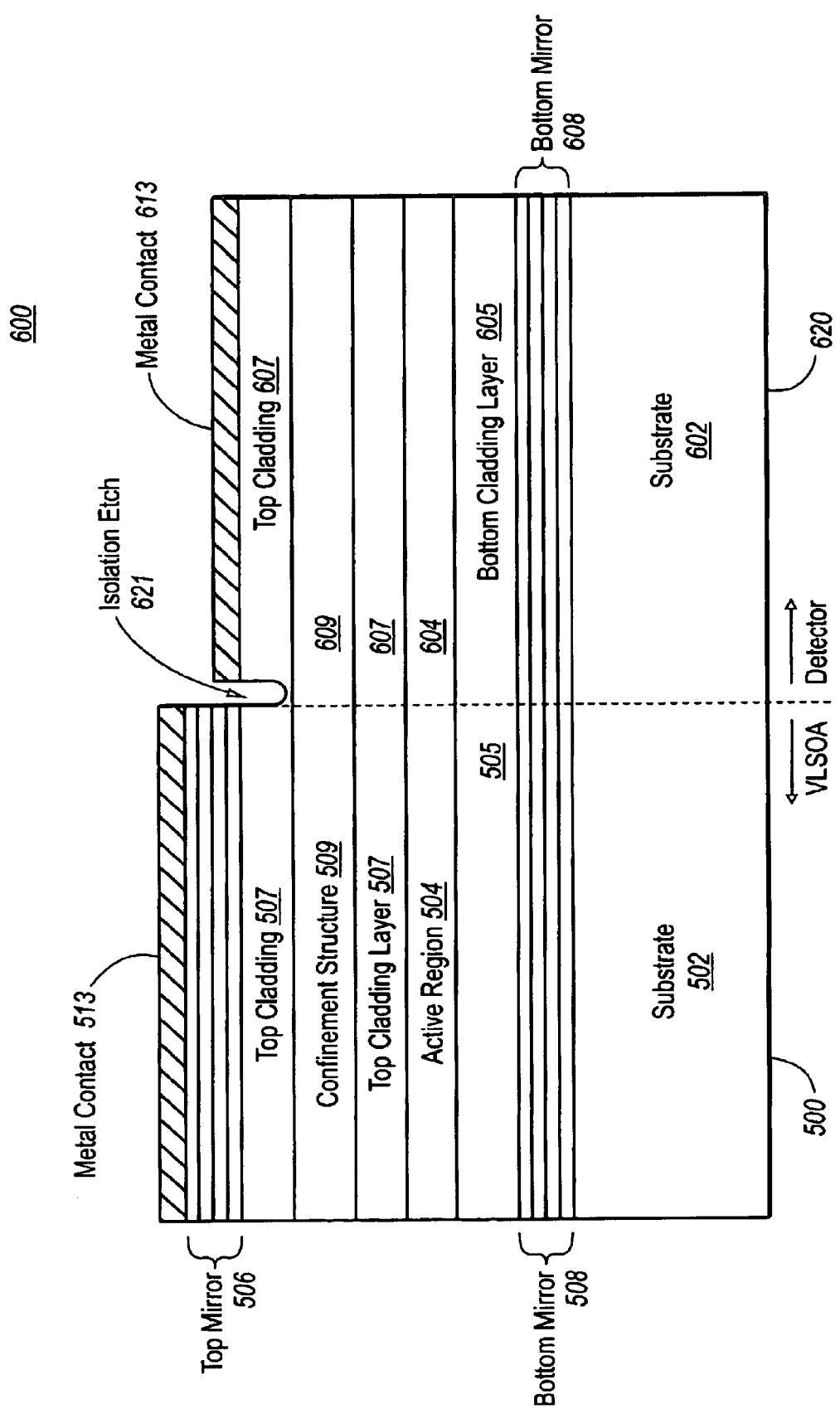
FIG. 4 is a simplified longitudinal cross-sectional view of an example integrated optical receiver 600 which includes a VLSOA 500 coupled directly a photodetector 620.
Figure 5:
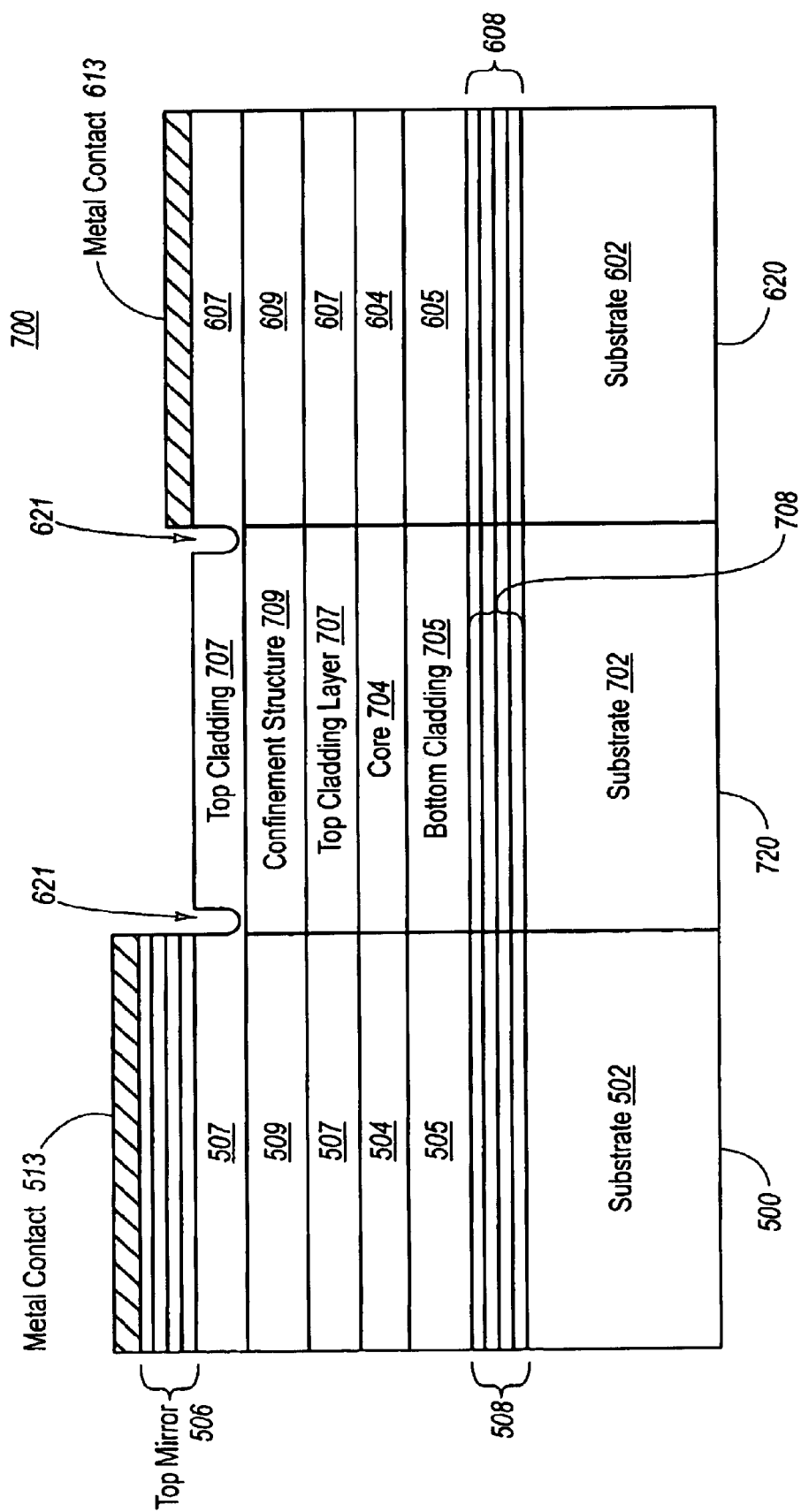
FIG. 5 is a simplified longitudinal cross-sectional view of an example integrated optical receiver 700 which includes a VLSOA 500 coupled to a waveguide 720 coupled to a photodetector 620.

FIGS. 4 and 5 are block diagrams of example integrated optical receivers. The devices shown are simplified for clarity. The invention is not limited to these specific structures.

FIG. 4 is a simplified longitudinal cross sectional view of an integrated optical receiver 600 which includes a VLSOA 500 coupled to a photodetector 620. Many designs for VLSOA 500 and photodetector 620 are appropriate, but in the following description, VLSOA 500 is assumed to follow the design of FIG. 3B and photodetector 620 is assumed to be similarly constructed. As illustrated in FIG. 4, the layers of VLSOA 500 continue into photodetector 620. In particular, substrate 502 transitions into substrate 602, bottom mirror 508 transitions to bottom mirror 608, bottom cladding layer 505 transitions into bottom cladding layer 605, active region 504 transitions into active region 604 of the photodetector, top cladding layer 507 transitions into top cladding layer 607, and confinement structure 509 transitions into confinement structure 609. In addition, VLSOA 500 has a top mirror 506 and a metal contact 513 above top cladding layer 507. By contrast photodetector 620 has a metal contact 613 above top cladding layer 607. Electrical isolation (in this example, isolation etch 621 which extends partway into the top cladding layer 507–607) is used to provide electrical isolation (or at least an increased resistance) between VLSOA 500 and photodetector 620.

Some of these layers transition from one element to the next because they perform analogous functions from element to element. The bottom cladding layers 505–605, active regions 504–604, and top cladding layers 507–607 are examples of this. Other layers are present in multiple elements because it is convenient from a fabrication standpoint. For example, bottom mirror 608 is not required for photodetector 620 but is present because it is simpler to fabricate the mirror than to not fabricate it.

In one embodiment, photodetector 620 is a waveguide PIN photodetector, and substrate 502 is identical to substrate 602, bottom cladding layer 505 is identical to bottom cladding layer 605, active region 504 is identical to active region 604, top cladding layer 507 is identical to top cladding layer 607 and confinement structure 509 is identical to confinement structure 609. The substrate and bottom cladding layers are doped n-type, and the top cladding layers and top mirror are doped p-type. The VLSOA is forward biased to provide gain by applying a positive voltage (with respect to a substrate contact) to metal contact 513. The PIN photodetector is reverse biased to provide a photocurrent by applying a negative voltage (with respect to a substrate contact) to metal contact 613.

In one embodiment, the active region 504 and the active region 604 are fabricated by starting with a common structure for the two and then changing the "transition energy" in one of the two areas to achieve different properties. The term "transition energy" is used to mean the change in energy for the energy transitions which are relevant to a particular device. In many devices, the transition energy is determined by the bandgap energy of the bulk materials of the device. However, the transition energy can also be affected by other parameters as well. For example, in quantum wells, the quantum confinement energy also affects the transition energy. As a result, changing the width of quantum wells without changing the bulk material composition can result in changes in the transition energy. Semiconductor structures are transparent, meaning that they have much lower absorptions, for light with photon energies which are less than the transition energy for the structure. Transparent structures are important in devices such as waveguides, which simply pass an optical signal without absorbing any of the optical signal.

In one embodiment of photodetector 620, active region 604 is designed so that the transition energy is less than the photon energies of VLSOA active region 504. This is accomplished by altering the material composition and/or layer thickness of active region 604 in order to achieve a low transition energy in photodetector active region 604. The lower transition energy increases the absorption within the photodetector active region enabling reduced wavelength sensitivity, shorter photodetector length and higher speed operation.

FIG. 5 illustrates another embodiment of the invention. In this embodiment, a waveguide 720 is integrated between VLSOA 500 and photodetector 620. The waveguide region is designed to be transparent so that the waveguide does not affect the optical signal. Thus, the waveguide is designed to have a transition energy greater than the photon energies of the optical signals that will pass through the waveguide. In this embodiment, bottom cladding layers 505 and 705 are identical as are top cladding layers 507 and 707. However active region 504 and core 704 are different Core 704 is transparent at the wavelength of interest (or at least absorption has somewhat been minimized) whereas active region 504 is designed to support the amplification function of VLSOA 500. The core 704 and active region 504 are aligned in order to reduce the optical reflection at the interface of the two optical elements and also to increase the coupling efficiency between the two optical elements. In addition, no metal contact is required if the waveguide 720 is passive. Similar techniques can be used to integrate filters and WDDs, such as arrayed waveguide gratings.

Figure 6:
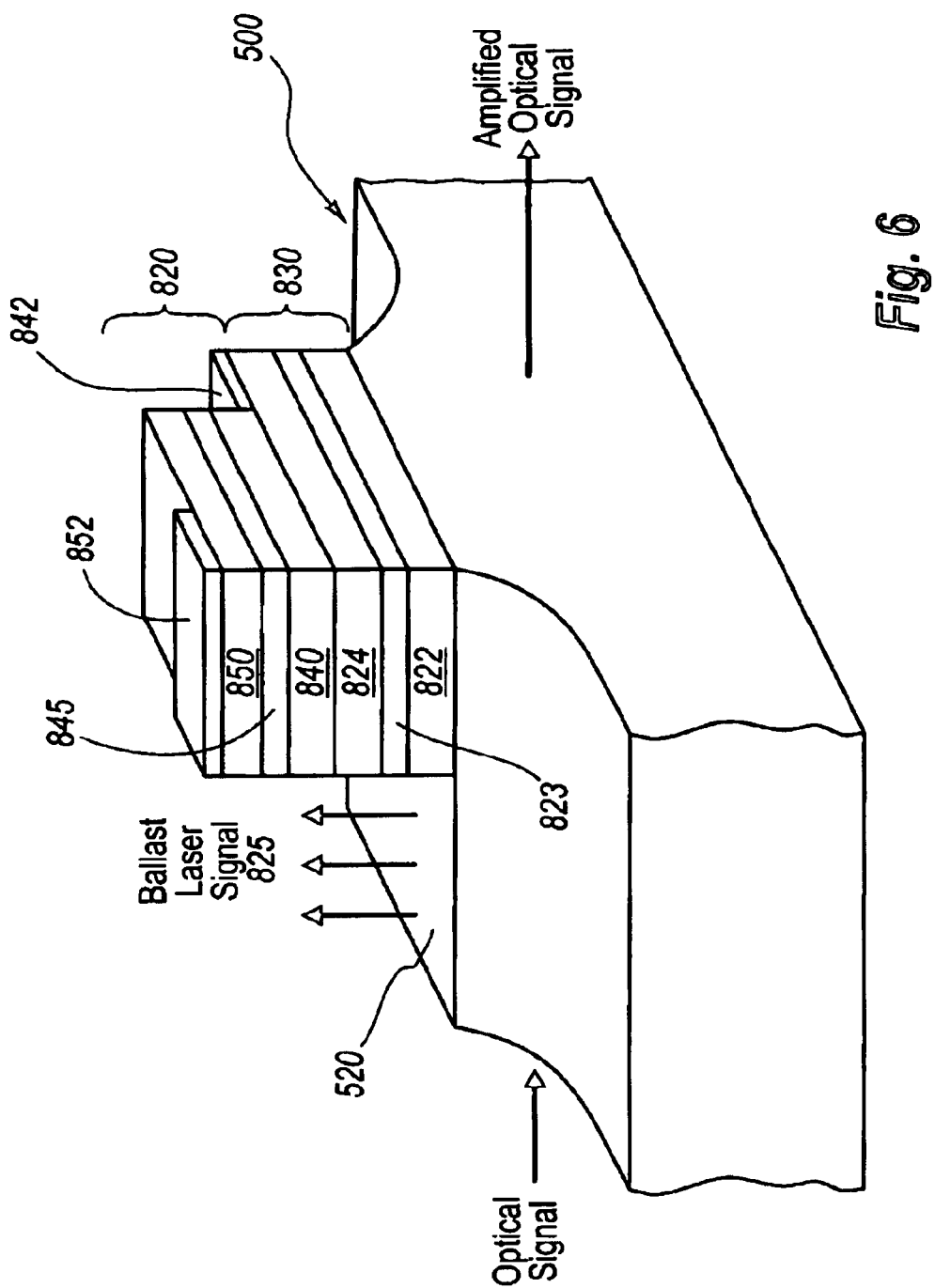
FIG. 6 is a simplified perspective view of another implementation of an optical receiver.
Figure 7:
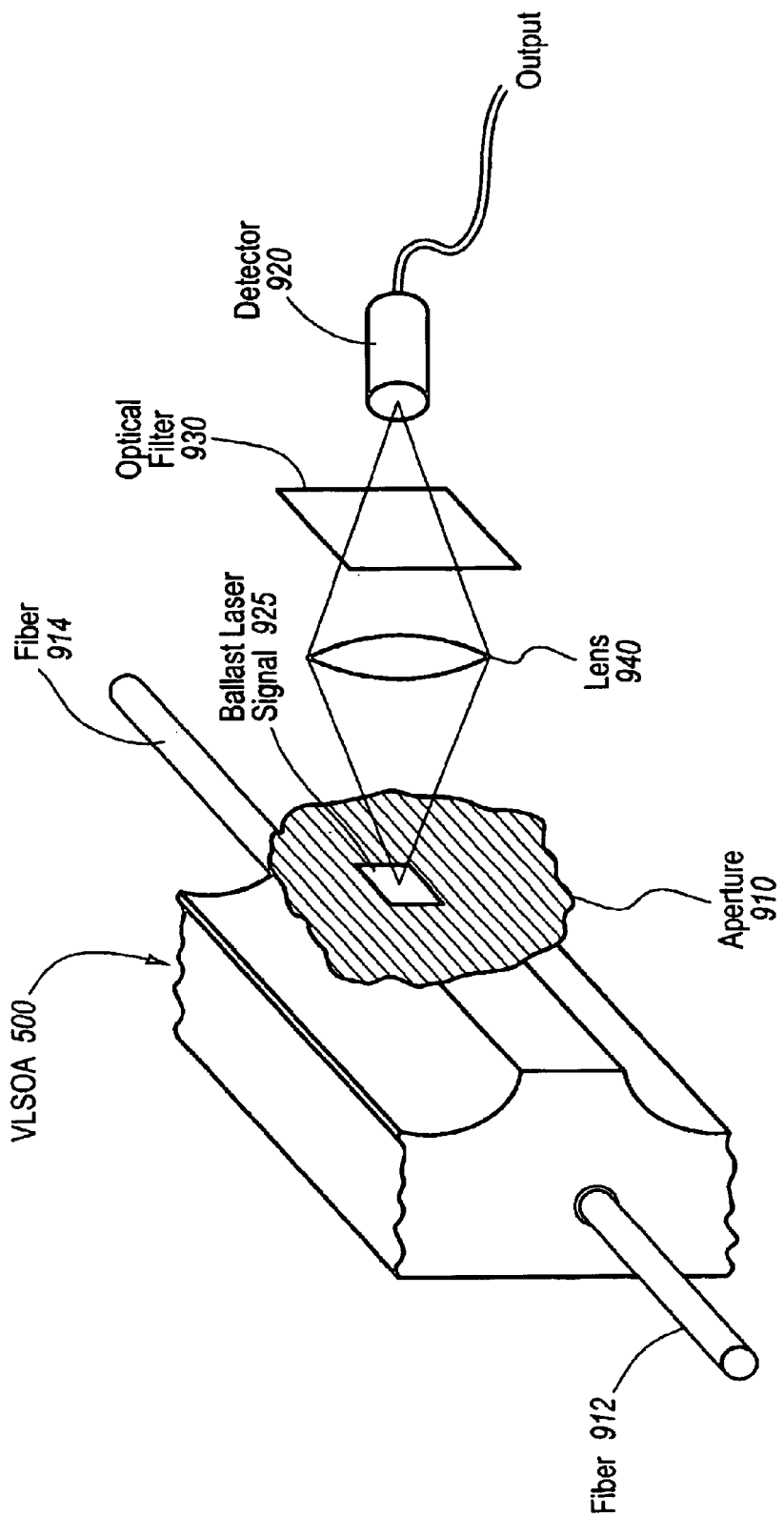
FIG. 7 is a simplified perspective view of another implementation of an optical receiver.

FIGS. 6 and 7 are simplified perspective views of further examples of optical receivers. In these examples, the VLSOA 500 has the structure shown in FIG. 3 although not as much detail is shown in FIGS. 6 and 7 for purposes of clarity. In addition, the photodetectors 820 and 920 are coupled to receive the optical output from laser cavity 540 (see FIG. 3) of VLSOA 500, rather than the amplified optical signal. For clarity, the optical output from the laser cavity will be referred to as the ballast laser signal 825, 925. The ballast laser signal is generally inversely related to the incoming optical signal, this effect being strongest toward the output end of the VLSOA. In other words, the ballast laser signal decreases in strength when the incoming optical signal increases in strength.

Using the ballast laser signal rather than the amplified optical signal has several advantages. For example, using the ballast laser signal naturally results in some filtering of noise, including ASE noise from the amplifier. This natural filtering of the ASE noise from the amplifier is both spatial (because the ballast laser signal is emitted in a direction perpendicular to the ASE noise) and spectral (because the laser cavity of the VLSOA is a high finesse cavity) and therefore acts as a filter that is "self-aligned" to the ballast laser signal. Another advantage is that the wavelength of the ballast laser signal does not vary with the wavelength of the incoming optical signal. This simplifies the design of the photodetector and related optics (e.g., filters). As a final example, there are some integration advantages as will be seen in FIG. 6.

In FIG. 6, a VLSOA 500, an optional optical filter 830 and detector 820 are vertically integrated on a common substrate. The VLSOA 500 outputs the ballast laser signal 825 through its top surface 520. Some or all of this ballast laser signal 825 enters the optical filter 830.

The optical filter 830 is implemented as a Fabry-Perot filter integrated directly above the top surface 520 of the VLSOA 500. The Fabry-Perot filter 830 includes two mirrors 824 and 822 separated by an optical cavity 823. In this example, the mirrors 822 and 824 are InP/InGaAsP Bragg mirrors. The cavity 823 is formed from typical materials such as InP, InGaAsP or InGaAs, and it typically has an optical path length which is an integer number of half wavelengths. Examples of other materials suitable for use in cavity 823, mirror 824 and mirror 822 include other semiconductor materials (e.g., InP/InGaAs, GaAs/AlGas, AlInGaAs, AlN, InGaAsN, GaN, Si, and amorphous-Si), dielectric materials (e.g., SiO2, MgO and Al2O3) and polymer materials. The ballast laser signal 825 emitted through the VLSOA top surface 520 enters the first mirror 822 at a right angle to its surface. The light resonates within the cavity 823, causing only the resonant wavelengths to add in phase. The length of the cavity 823 determines the resonant wavelengths. The resonant wavelengths are transmitted through the second mirror 824 to the detector 820.

The detector 820 is integrated directly above the Fabry-Perot filter 830. In the example of FIG. 6, the detector 820 is a PIN detector. From bottom to top, it includes a bottom cladding layer 840 which is either n or p doped, an undoped or intrinsic absorbing layer 845, and a top cladding layer 850 which has the opposite doping as the bottom cladding layer 840. Electrical contacts 842 and 852 are made to the bottom and top cladding layers 840 and 850, respectively. In the example shown in FIG. 6, the top and bottom cladding layers 840–850 are InP and the absorbing layer 845 is InGaAs. The filtered ballast laser signal is absorbed in the lower bandgap intrinsic layer 845 and electron-hole pairs are generated. The built-in field surrounding the p-i-n junction sweeps out the holes to the higher bandgap p-region and the electrons to the higher band gap n-region and thus generates a current between the two electrical contacts 842, 852. The built-in field can be enhanced by reverse biasing the p-i-n junction. If the filter 830 is electrically conductive, the top electrical contact 510 to the VLSOA 500 (see FIG. 3B) and the bottom electrical contact 842 to the detector 820 may be implemented as a single contact.

FIG. 7 is a perspective view of another implementation of an optical receiver, in which the VLSOA 500, optional optical filter 930 and detector 920 are discrete components.

The amplifier input and output of the VLSOA 500 are coupled to fiber pigtails 912 and 914. A lens 940 collects some or all of the ballast laser signal 925 generated by VLSOA 500 and deposits it onto the detector 920. An aperture 910 placed over the top surface 520 of VLSOA 500 defines the extent of the ballast laser signal 925 which is collected by the lens 940. The optical filter 930 is located in the optical path between the VLSOA 500 and the detector 920. The discrete elements are held in position using conventional opto-mechanical packaging techniques.

In FIGS. 6 and 7, the ballast laser signal from VLSOA 500 is coupled to a photodetector 820,920. In other implementations, the lasing semiconductor optical amplifier is based on geometries other than vertical cavity. For example, the laser cavity can be oriented longitudinally with respect to (i.e., aligned with) the amplifying path. Alternately, the laser cavity can be oriented transversely (or otherwise off-axis) with respect to the amplifying path. In these geometries, the output of the laser cavity can also be coupled to a photodetector, resulting in some self-aligned filtering as described above with respect to VLSOAs. Conventional techniques, such as splitters, wavelength division demultiplexer, arrayed waveguide gratings, coupled waveguide filters, and polarization dependent filters, can be used to separate the ballast laser signal from the amplified optical signal if necessary (e.g., if they are propagating colinearly).

The integration of VLSOAs with a waveguide, photodetector or other optical elements may be implemented using other techniques also. For example, see also FIGS. 7–12 and the accompanying text of U.S. patent application Ser. No. 10/014,679, "Integrated Optical Device Including a Vertical Lasing Semiconductor Optical Amplifier," by Jeffrey D. Walker et al., filed Dec. 11, 2001, which is incorporated herein by reference. In one approach, both the VLSOA and the other optical element are formed using a common fabrication process on a common substrate, but with at least one parameter varying between the VLSOA and the optical element. Selective area epitaxy (SAE) and impurity induced disordering (IID) are two fabrication processes which may be used in this manner.

In one approach based on SAE, a nitride or oxide SAE mask is placed over selected Areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide or active region of a photodetector, with the difference in transition energy accounting for the different optical properties of the active region and the core or photodetector. SAE is particularly advantageous because it results in a smooth interface between optical elements and therefore reduces optical scattering at this interface. This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide or active region of a photodetector, with the difference in transition energy again accounting for the different optical properties.

In the previous SAE and IID examples, the difference in transition energy results in different optical properties between the VLSOA active region and a waveguide core or photodetector active region. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent to one skilled in the art.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide or photodetector is to be located, these materials are removed and additional materials are deposited to form the waveguide or photodetector (or at least a portion of it). This process has the advantage that it allows independent optimization of the photodetector design for sensitivity, wavelength response, time response, and other properties.

For example, the etch and fill process can be used to fabricate a VLSOA integrated with an avalanche photodiode (APD). In this embodiment, materials are deposited to form the VLSOA (or at least a portion of the VLSOA). In the area in which the APD is to be located, the materials are removed and additional materials which make up the APD are deposited in their place.

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first InP substrate. An arrayed waveguide grating WDD is formed on a second silicon substrate. The VLSOA and the WDD are then integrated onto a common substrate, which could be the first substrate, the second substrate or a completely different substrate The VLSOA and optical element may be butt coupled or coupled by a lens, fiber, or other optical element. The common substrate may include a ceramic submount or other rigid surface.

The examples disclosed above are merely illustrative. Other optical receivers which take advantage of some or all of the VLSOA's advantages, including small size, possibility of integration, linear amplification, fast response time and good crosstalk performance (with both TDM and WDM optical signals), will be apparent. For example, VLSOAs and/or photodetectors with structures other than those shown in FIGS. 3–7 may be utilized. As another example, optical receivers which couple VLSOAs to photodetectors in architectures other than those shown in FIGS. 1–2 can also be realized. As a final example, FIGS. 1–2 focus on the VLSOAs and photodetectors for clarity. However, optical receivers can include additional optical elements, including optical filters, other types of optical amplifiers, optical taps, and optical splitters and combiners.

What is claimed is:

1. An optical receiver comprising:
   a vertical lasing semiconductor optical amplifier (VLSOA) comprising:
   a semiconductor active region;
   an amplifying path traversing the semiconductor active region; and
   a laser cavity including the semiconductor active region, wherein the laser cavity is oriented vertically with respect to the amplifying path and pumping the laser cavity above a lasing threshold clamps a gain along the amplifying path to a substantially constant value; and
   a photodetector coupled to the VLSOA.

2. The optical receiver of claim 1 wherein the photodetector is selected from a group consisting of a PIN diode and an avalanche photodiode.

3. The optical receiver of claim 1 further comprising:
   an optical fiber coupling the VLSOA to the photodetector, wherein the VLSOA and the photodetector are discrete components.

4. The optical receiver of claim 1 wherein the VLSOA and the photodetector are integrated onto a common substrate.

5. The optical receiver of claim 4 wherein the VLSOA is directly coupled to the photodetector.

6. The optical receiver of claim 4 wherein:
   the photodetector comprises an active region; and
   the semiconductor active region of the VLSOA transitions into the active region of the photodetector.

7. The optical receiver of claim 6 wherein:
   the VLSOA further comprises a bottom cladding layer and a top cladding layer;
   the photodetector further comprises a bottom cladding layer and a top cladding layer;
   the bottom cladding layer of the VLSOA transitions into the bottom cladding layer of the photodetector; and
   the top cladding layer of the VLSOA transitions into the top cladding layer of the photodetector.

8. The optical receiver of claim 4 further comprising:
   an optical waveguide coupling the VLSOA to the photodetector, wherein the optical waveguide is also integrated onto the common substrate.

9. The optical receiver of claim 8 wherein:
   the optical waveguide comprises a core;
   the photodetector comprises an active region; and
   the semiconductor active region of the VLSOA transitions into the core of the optical waveguide, which transitions into the active region of the photodetector.

10. The optical receiver of claim 4 wherein:
    the photodetector comprises an active region; and
    the semiconductor active region of the VLSOA and the active region of the photodetector are based on a common structure which has been altered so that the semiconductor active region of the VLSOA has a different transition energy than the active region of the photodetector.

11. The optical receiver of claim 4 wherein:
    the photodetector comprises an active region; and
    the semiconductor active region of the VLSOA and the active region of the photodetector have a same structure but are electrically biased differently so that the semiconductor active region of the VLSOA has a different transition energy than the active region of the photodetector.

12. The optical receiver of claim 4 wherein the common substrate is an InP substrate.

13. The optical receiver of claim 4 wherein the optical receiver operates at a wavelength between 1.3 micron and 1.7 micron.

14. The optical receiver of claim 4 wherein the optical receiver is capable of detecting data at a data rate of at least 10 Gbps.

15. The optical receiver of claim 1 further comprising:
    at least one additional photodetector; and
    an optical splitter coupling the VLSOA to the photodetectors.

16. The optical receiver of claim 15 further comprising:
    a semiconductor optical amplifier coupling the optical splitter to one of the photodetectors.

17. The optical receiver of claim 15 further comprising:
    a plurality of optical amplifiers coupling the optical splitter to the photodetectors for equalizing optical signals received by the photodetectors.

18. The optical receiver of claim 15 wherein the VLSOA, the optical splitter and the photodetectors are integrated onto a common substrate.

19. The optical receiver of claim 15 wherein the optical splitter comprises a wavelength division demultiplexer.

20. The optical receiver of claim 15 wherein the optical splitter comprises an arrayed waveguide grating.

21. The optical receiver of claim 1 further comprising:
    a feedback loop between the photodetector and the VLSOA for adjusting the substantially constant value.

22. The optical receiver of claim 1 wherein the photodetector is coupled to receive a ballast laser signal from the laser cavity of the VLSOA.

23. The optical receiver of claim 22 wherein the photodetector is vertically integrated with the VLSOA.

24. The optical receiver of claim 23 further comprising:
    an optical filter vertically integrated between the VLSOA and the photodetector.

25. An optical receiver comprising:
    a gain-clamped semiconductor optical amplifier comprising:
    a semiconductor active region;
    an amplifying path traversing the semiconductor active region; and
    a laser cavity including the semiconductor active region, wherein pumping the laser cavity above a lasing threshold clamps a gain along the amplifying path to a substantially constant value; and
    a photodetector coupled to receive a ballast laser signal from the laser cavity of the gain-clamped semiconductor optical amplifier.

26. The optical receiver of claim 25 wherein the laser cavity is oriented transversely with respect to the amplifying path.

27. The optical receiver of claim 25 wherein the laser cavity is oriented longitudinally with respect to the amplifying path.

28. The optical receiver of claim 25 further comprising:
    an optical filter located between the gain-clamped semiconductor optical amplifier and the photodetector.

29. The optical receiver of claim 25 further comprising:
    a feedback loop between the photodetector and the gain-clamped semiconductor optical amplifier for adjusting the substantially constant value.

* * * * *